(12) United States Patent
Morishima

(10) Patent No.: US 8,169,260 B2
(45) Date of Patent: May 1, 2012

(54) AMPLIFIER CIRCUIT UTILIZING CHARACTERISTIC CORRECTION AND SMOOTH CURVILINEAR CORRECTION

(75) Inventor: Morito Morishima, Fukuroi (JP)

(73) Assignee: Yamaha Corporation, Hamamatsu-shi (JP)

( * ) Notice: Subject to any disclaimer, the term of this patent is extended or adjusted under 35 U.S.C. 154(b) by 88 days.

(21) Appl. No.: 12/661,851

(22) Filed: Mar. 25, 2010

(65) Prior Publication Data

US 2010/0244966 A1  Sep. 30, 2010

(30) Foreign Application Priority Data

Mar. 27, 2009 (JP) ................. P2009-079463

(51) Int. Cl.
*H03G 3/20* (2006.01)

(52) U.S. Cl. .......................... 330/2; 330/129

(58) Field of Classification Search .............. 330/2, 129; 381/94.1
See application file for complete search history.

(56) References Cited

U.S. PATENT DOCUMENTS

| 7,783,062 | B2 * | 8/2010 | Xiao ........................... 381/94.1 |
| 2007/0103234 | A1 | 5/2007 | Maejima |
| 2009/0252347 | A1 * | 10/2009 | Kakkeri et al. ............... 381/107 |

FOREIGN PATENT DOCUMENTS

| JP | 2007-124624 | 5/2007 |
| JP | 2007-124625 | 5/2007 |

* cited by examiner

*Primary Examiner* — Steven J Mottola
(74) *Attorney, Agent, or Firm* — Pillsbury Winthrop Shaw Pittman LLP

(57) ABSTRACT

An amplifier circuit performs a characteristic correction process and a smooth curvilinear process on an input signal before being subjected to amplification. The characteristic correction process is a frequency characteristic process, which is performed on the input signal so as to produce a processed signal (Vp). Either the input signal or the processed signal, or the mixture of these signals is subjected to the smooth curvilinear process whose start point is designated by a state variation of amplification (VxTyp). Alternatively it is subjected to a gain decrement process instead of the smooth curvilinear process when the state variation of amplification is less than a default value (VxTHD). Thus, it is possible to prevent clipping from occurring in the amplified output signal while maintaining an adequate power.

13 Claims, 6 Drawing Sheets

AMPLIFIER CIRCUIT UTILIZING CHARACTERISTIC CORRECTION AND SMOOTH CURVILINEAR CORRECTION

BACKGROUND OF THE INVENTION

1. Field of the Invention

The present invention relates to amplifier circuits such as power amplifiers adapted to audio devices.

The present application claims priority on Japanese Patent Application No. 2009-79463, the content of which is incorporated herein by reference.

2. Description of the Related Art

Conventionally, amplifier circuits have been used to drive electric loads (e.g. speakers) in response to input signals (e.g. audio signals). When the level of an input signal exceeds a predetermined range of amplitude, an amplifier circuit is subjected to clipping with respect to the waveform of an output signal. Upon receipt of an output signal having a clipped level from an amplifier circuit, a speaker (serving as an electric load) may produce an artificially-distorted and offensive sound. For this reason, it is necessary to prevent clipping from occurring in waveforms of amplified signals.

Various types of amplifier circuits employing clipping prevention measures have been developed and disclosed in various documents.

Patent Document 1: Japanese Patent Application Publication No. 2007-124624

Patent Document 2: Japanese Patent Application Publication No. 2007-124625

Conventionally, amplifier circuits employing clipping prevention measures haven been designed to adjust the level of an input signal before forming an output signal or to appropriately adjust an amplification factor. For example, Patent Document 1 employs interrupted attenuation of an input signal, and Patent Document 2 employs a gain controller for decreasing a gain of amplification.

However, the above measures bring a decline in the level of an output signal of an amplifier circuit, thus causing a speaker to produce a deficient sound lacking power and dynamics.

SUMMARY OF THE INVENTION

It is an object of the present invention to provide an amplifier circuit which prevents clipping from occurring in the waveform of an output signal while maintaining power and dynamics.

An amplifier circuit of the present invention is designed to perform a smooth curvilinear process on an input signal before amplification in response to a state variable of amplification.

Specifically, an input signal (Vi) is converted into a first conversion signal (Vg) by way of a first gain correction; the first conversion signal is converted into a second conversion signal (Vx) by way of a characteristic correction process corresponding to a frequency characteristic process; the second conversion signal is converted into a third conversion signal (Vc) by way of the smooth curvilinear process in response to the state variable of amplification (VxTyp); the third conversion signal is converted into a fourth conversion signal (Vd) by way of a second gain correction; then, the fourth conversion signal is subjected to amplification to produce an output signal (e.g. a speaker drive signal Vo). As the second conversion signal, either the first conversion signal (Vg) or a processed signal (Vp) which is processed by the characteristic correction process, or the mixture of these signals is subjected to the smooth curvilinear process to produce the third conversion signal.

In the smooth curvilinear process, the second conversion signal is gradually and smoothly varied in level along with the smooth curvilinear relationship. Compared with the linear proportional relationship in which the third conversion signal increases in linear proportion with the second conversion signal, the present invention suppresses the increase rate of the third conversion signal by way of the smooth curvilinear relationship. The linear proportional relationship is advantageous in that it can prevent clipping from occurring in the waveform of the output signal, while the smooth curvilinear relationship is advantageous in that it can maintain an adequate power in the output signal. For this reason, the present invention changes the processing in response to the state variable of amplification (VxTyp), which is compared to a default value (VXTHD). Specifically, the smooth curvilinear process is performed when VxTyp≧VXTHD, while the gain decrement process is performed when VxTyp<VXTHD.

In a simple translation of the present invention, an amplifier circuit includes an amplifier (50) that amplifies a first signal (Vd) so as to produce a second signal (Vo), and a corrector (30, 40) that receives a third signal (Vx) so as to perform a smooth curvilinear process on a part or the entirety of the third signal based on a state variable, which varies in response to the state of the amplifier, thus producing the first signal.

Thus, it is possible to reliably prevent clipping from occurring in the output signal while maintaining an adequate power in the output signal.

BRIEF DESCRIPTION OF THE DRAWINGS

These and other objects, aspects, and embodiments of the present invention will be described in more detail with reference to the following drawings.

DESCRIPTION OF THE PREFERRED EMBODIMENT

The present invention will be described in further detail by way of examples with reference to the accompanying drawings. In this connection, these drawings do not necessarily reflect the accurate dimensions and factors in designing the circuitry.

Figure 1:
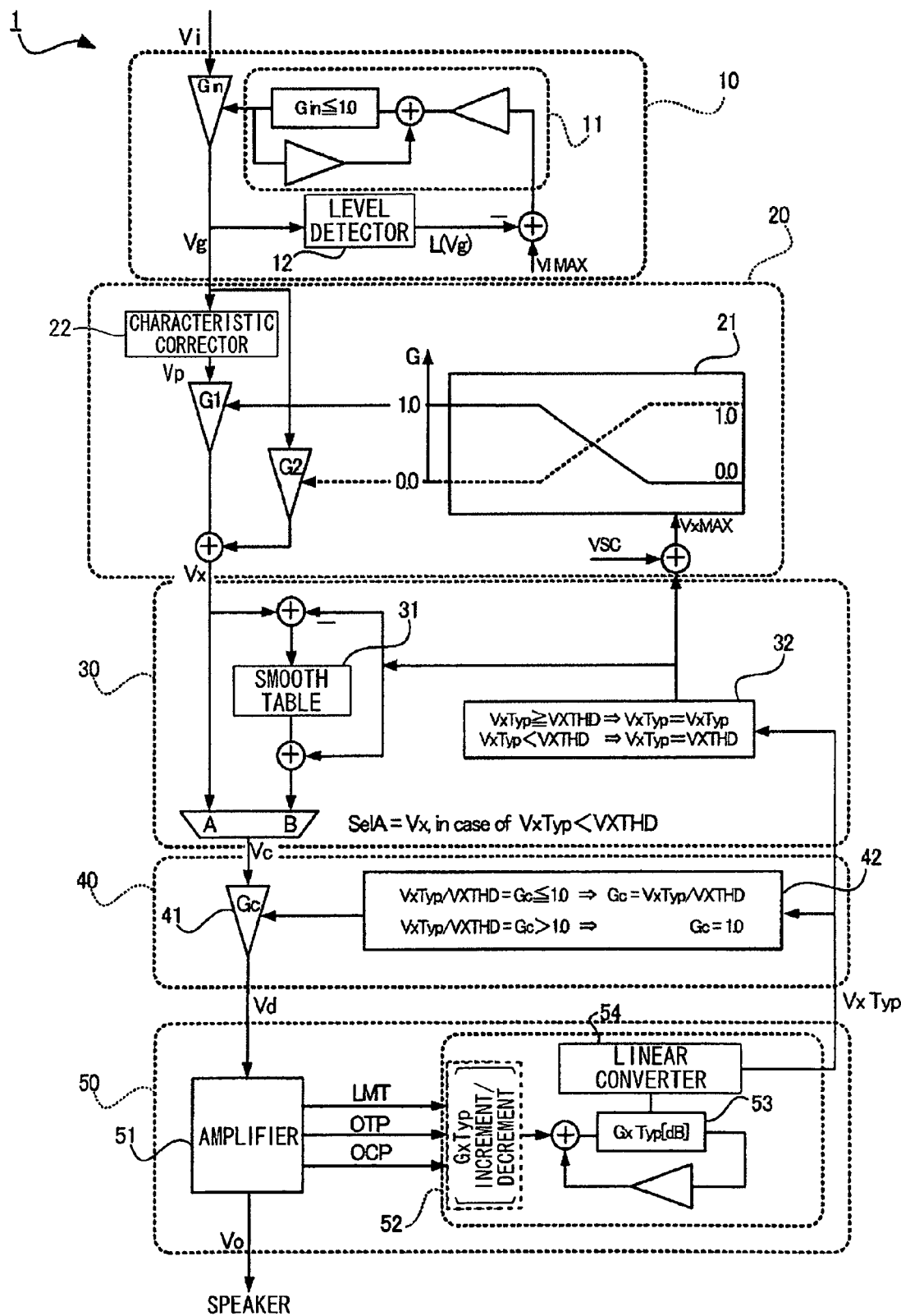
FIG. 1 is a block diagram showing the constitution of an amplifier circuit according to a preferred embodiment of the present invention.

FIG. 1 is a block diagram of an amplifier circuit 1 according to a preferred embodiment of the present invention. The amplifier circuit 1 is constituted of a first gain correction unit 10, a characteristic correction unit 20, a smooth curvilinear correction unit 30, a second gain correction unit 40, and an amplification unit 50.

The first gain correction unit 10 includes a low-pass filter (LPF) 11 and a level detector 12. The first gain correction unit 10 transmits an input signal Vi toward the characteristic correction unit 20. Herein, the first gain correction unit 10 converts the input signal Vi into a first conversion signal Vg while fixing the maximum value of the first conversion signal Vg to the predetermined value.

Specifically, the level detector 12 detects a level L(Vg) with respect to a gain-corrected input signal, i.e. the first conversion signal Vg. The first gain correction unit 10 sets a gain coefficient Gin (which is applied to the input signal Vi) based on the detected level L(Vg) and a default value VI MAX. Herein, the gain coefficient Gin is set in such a way that the first conversion signal Vg (corresponding to the input signal Vi multiplied by the gain coefficient Gin) cannot exceed the preset value VI MAX. This establishes the inequality of Vg≦VI MAX (where Vg=Vi·Gin), wherein the maximum value VgMAX of the first conversion signal Vg should be equal to or less than VI MAX). The low-pass filter 11 eliminates jaggy noise occurring in the difference between the level L(Vg) and the default value VI MAX.

The characteristic correction unit 20 includes a gain coefficient adjuster 21, a characteristic correction processor 22 for performing characteristic correction process, and multipliers having gain coefficients G1 and G2 (which are arbitrarily determined). The characteristic correction processor 22 performs a parametric equalizing process on speaker correction or volume correction, for example. Specifically, the characteristic correction processor 22 boosts the level of a low-frequency component of the first conversion signal Vg. The characteristic correction processor 22 performs the characteristic connection on the first conversion signal Vg so as to produce a processed signal Vp.

The present embodiment is characterized in that the characteristic correction unit 20 performs complementary increment/decrement processes on the first conversion signal Vg and the processed signal Vp (corresponding to the first conversion signal Vg subjected to the characteristic correction processor 22) by use of the gain coefficients G1 and G2 respectively. In the case of G2=1 in which the first conversion signal Vg is not decremented in level, the gain coefficient G1 is set to "0" so as to ignore the processed signal Vp. In the case of G2=0 ignoring the first conversion signal Vg, the gain coefficient G1 is set to "1" so that the processed signal Vp is not decremented in level. In the case of 0<G1<1.0 indicating the "intermediate" decrement process on the first conversion signal Vg, the gain coefficient G1 is correspondingly varied so that the processed signal Vp is subjected to the intermediate decrement process as well. The type of the characteristic correction processor 22 depends upon the addition of a curvilinear start point VxTyp (which is regarded as one example of a state variable of amplification) and a default value VSC. The method how to determine the gain coefficients G1 and G2 and the property of the default value VSC will be described later.

The characteristic correction unit 20 adds the first conversion signal Vg multiplied by the gain coefficient G2 and the processed signal Vp multiplied by the gain coefficient G1 so as to produce a second conversion signal Vx, which is then supplied to the smooth curvilinear correction unit 30.

The smooth curvilinear correction unit 30 includes a smooth table 31 and a VxTyp setting portion 32. Basically, the smooth curvilinear correction unit 30 supplies the second gain correction unit 40 with a third conversion signal Vc in response to the second conversion signal Vx. Herein, the maximum value VxMAX of the second conversion signal Vx does not become lower than a minimum value VCTHD (which will be described later in conjunction with FIGS. 2A and 2B).

The smooth table 31 and the VxTyp setting portion 32 cooperate to perform a smooth curvilinear process on the second conversion signal Vx to meet the aforementioned conditions and other conditions.

That is, the smooth table 31 performs the smooth curvilinear process on the second conversion signal Vx whose level is higher than a predetermined threshold. Herein, the second conversion signal Vx is not linearly converted into the third conversion signal Vc, whereas the second conversion signal Vx is converted into the third conversion signal Vc in accordance with the smooth curvilinear relationship ascribed to the smooth curvilinear process. Considering the linear relationship of Vy=a·Vx (where "a" is an arbitrary constant), for example, Vc is not simply given as Vc=Vy but as Vc=F(Vx) (where "F" denotes an arbitrary function representing the characteristic correction processor 22).

The smooth table 31 stores various examples of functions, such as the logarithmic function and trigonometric function.

In the present embodiment, the conversion process based on the function F is not always performed on the second conversion signal Vx regardless of its level. The present embodiment is characterized by performing the conversion process on the second conversion signal Vx whose level is higher than the predetermined threshold selectively.

The VxTyp setting portion 32 designates the predetermined threshold for starting the smooth curvilinear process. That is, the VxTyp setting portion 32 sets or updates the curvilinear start point VxTyp based on the magnitude comparison between the "original" curvilinear start point VxTyp (which is originally designated by the amplification unit 50) and a default value VXTHD. The range of the second conversion signal Vx subjected to the smooth curvilinear process is determined upon the comparison between the set value (or updated value) of the curvilinear start point VxTyp and the level of the second conversion signal Vx.

The second gain correction unit 40 includes a multiplier 41 having a gain coefficient Gc and a Gc setting portion 42 for setting the gain coefficient Gc. Basically, the gain coefficient Gc is given as a ratio between the curvilinear start point VxTyp and the default value VXTHD, where Gc=VxTyp/VXTHD. Herein, the Gc setting portion 42 sets the gain coefficient Gc with reference to a boundary value of "1.0", wherein it rectifies the gain coefficient Gc to be either greater than or less than "1.0". Specifically, the gain coefficient Gc is not rectified as long as it falls within the range of Gc=VxTyp/VXTHD≦1, whereas when Gc=VxTyp/VXTHD>1, the gain coefficient Gc is fixed to 1.0 (where Gc=1.0) regardless of the ratio of VxTyp/VXTHD.

The second gain correction unit 40 multiplies the third conversion signal Vc by the gain coefficient Gc so as to produce a fourth conversion signal Vd, which is then supplied to the amplification unit 50.

The amplification unit 50 includes an amplifier 51 which amplifies the fourth conversion signal Vd so as to produce a speaker drive signal Vo, which is then supplied to a speaker (not shown).

In addition, the amplification unit 50 includes a GxTyp increment/decrement processor 52, which further includes a GxTyp setting portion 53 and a linear converter 54.

Basically, the GxTyp increment/decrement processor 52 sets the value of GxTyp based on control signals LMT, OCP, and OTP output from the amplifier 51. The control signals LMT, OCT, and OTP represent the state of the amplifier, wherein the control signal LMT is output when the amplifier 51 detects a voltage exceeding its operational range; the control signal OCP (namely, "Over Current Protection") is output when the amplifier 51 detects a current exceeding an allowable current; and the control signal OTP (namely, "Over Temperature Protection") is output when the amplifier 51 detects the temperature exceeding an allowable temperature range.

The control signals LMT, OCP, and OTP are each configured of a binary signal which is regarded "active" at "1" or "non-active" at "0". When any one of the control signals LMT, OCP, and OTP becomes active, it is presumed that the amplifier 51 reaches a critical state.

The critical state of the amplifier 51 can be regarded as a critical state of a speaker which is a limit to maintain good sound quality or a limit to secure a stable operation. In this regard, the critical state of the amplifier 51 may indicate the warning that an excessive input signal should not be applied to the speaker or the amplifier 51 thereafter.

Through the increment/decrement process, the GxTyp setting portion 53 sets the value of GxTyp in units of decibels. That is, the GxTyp setting portion 53 functions to increment or decrement GxTyp in decibels. The linear converter 54 converts the value of GxTyp into a linear range. The linear converter 54 can be equipped with a low-pass filter (LPF), which is used to eliminate jaggy noise occurring in the linear conversion of GxTyp.

The value of GxTyp serves as a reference value which is used to set the curvilinear start point VxTyp and which is also used to determine the gain coefficients Gc, G1, and G2.

A simple manner of the GxTyp setting based on the control signals LMT, OCP, and OTP is to decrement a prescribed unit of GxTyp upon reception of one unit of the control signal LMT, for example.

Next, the operation of the amplifier circuit 1 will be described with reference to FIGS. 2A-2B, FIGS. 3A-3C, and FIG. 4.

The amplifier circuit of the present embodiment is designed to limit the signal level involved in the amplifier 51 in the critical state.

The determination as to whether or not the amplifier 51 is in the critical state depends upon the control signals LMT, OCP, and OTP each representing a digit "1" or a digit "0". Upon reception of the digit 1 in the GxTyp increment/decrement processor 52, it is determined that the amplifier 51 is in the critical state.

Asserting the critical state of the amplifier 51, the GxTyp setting portion 53 increments or decrements the value of GxTyp so as to lower the maximum value VoMAX of the speaker drive signal Vo output from the amplifier 51. Upon reception of one unit of the control signal LMT, the GxTyp setting portion 53 decrements one unit of GxTyp.

It is possible to set the value of GxTyp in various ways dependent upon the combination of the control signals LMT, OCP, and OTP, the weights imparted to the control signals LMT, OCP, and OTP, and the time lengths between the output timings of the control signals LMT, OCP, and OTP (in other words, the intervals of monitoring times for the amplifier 51), for example. Regarding the "combination", it is possible to greatly decrease the value of GxTyp when all the control signals LMT, OCP, and OTP are simultaneously set to "1", for example. Regarding the "weights", the value of GxTyp is varied in such a way that one unit of GxTyp is decremented when LMT=1 while two units of GxTyp are decremented when TCP=1, for example. Regarding the "time lengths", when the amplifier 51 is normally monitored with a short time interval, the value of GxTyp is not varied immediately when the control signal LMT is set to "1" but it is decremented when LMT=1 is sustained for a certain time, for example.

In this connection, the present embodiment embraces any types of measures for setting the value of GxTyp.

The value of GxTyp is subjected to the above increment/decrement process and is then subjected to the linear conversion by the linear converter 54, thus producing the curvilinear start point VxTyp.

Since the curvilinear start point VxTyp is determined based on the value of GxTyp, the curvilinear start point VxTyp varies correspondingly as the state of the amplifier 51 varies every moment. The curvilinear start point VxTyp is supplied to the smooth curvilinear correction unit 30 and the second gain correction unit 40.

As described above, the curvilinear start point VxTyp may take a different value every moment in response to the state of the amplifier 51 during the operation of the amplifier circuit 1 in progress. Based on such a momentarily varied value of VxTyp or based on the state of the amplifier 51, an appropriate signal conversion process is performed every moment so as to limit the signal level involved in the amplifier 51.

The smooth curvilinear correction unit 30 and the second gain correction unit 40 are involved in two stages of processing (classified as [I] and [II]) in terms of the usage of the curvilinear start point VxTyp.

[I] First Stage

First, the smooth curvilinear correction unit 30 uses the value of VxTyp to determine the "start point" of the smooth curvilinear process. The smooth curvilinear process produces the third conversion signal Vc in accordance with the function Vc=F(Vx), wherein the value of VxTyp is used to determine the range of the second conversion signal Vx leading to the adoption of the function F. This process will be described in detail with reference to FIGS. 2A and 2B.

Figure 2A:
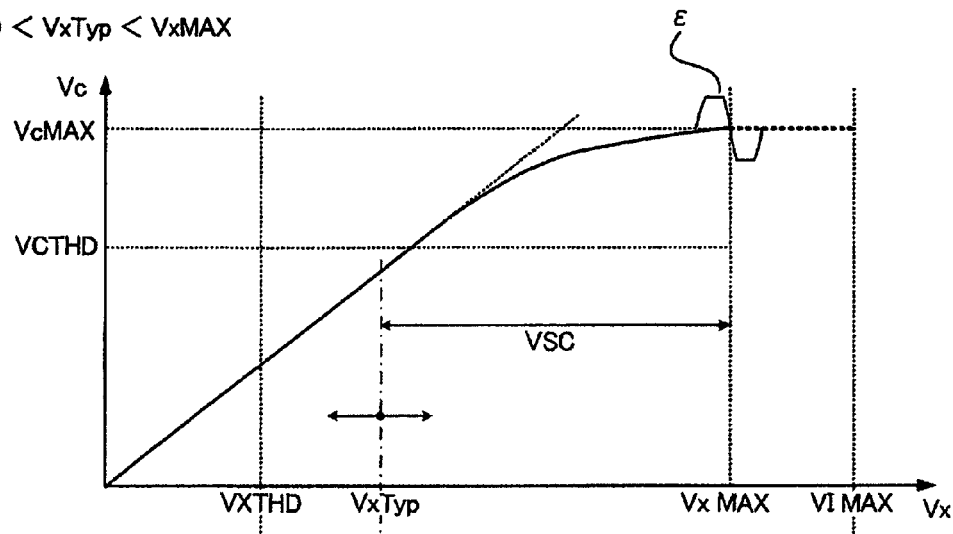
FIG. 2A is a graph explaining the smooth curvilinear process when VXTHD<VxTyp.
Figure 2B:
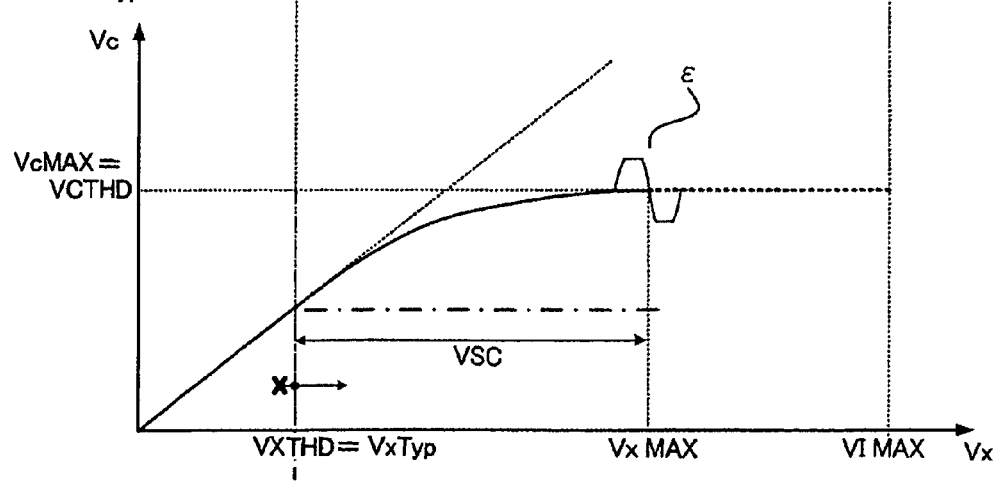
FIG. 2B is a graph explaining the smooth curvilinear process when VXTHD=VxTyp.

FIGS. 2A and 2B are graphs each of which is used to represent the relationship between the second conversion signal Vx (input to the smooth curvilinear correction unit 30) and the third conversion signal Vc (output from the smooth curvilinear correction unit 30). As shown in FIGS. 2A and 2B, the smooth curvilinear correction unit 30 produces the third conversion signal Vc in accordance with different principles dependent upon the magnitude comparison between Vx and VxTyp. In a first principle where Vx<VxTyp, the smooth curvilinear correction unit 30 produces the third conversion signal Vc in proportion to the second conversion signal Vx. That is, the smooth curvilinear correction unit 30 outputs the third conversion signal Vc in accordance with the linear relationship of Vy=a·Vx). In a second principle where Vx≧VxTyp, the smooth curvilinear correction unit 30 produces the third conversion signal Vc in accordance with the function Vc=F(Vx).

In the above, two instructions (i) and (ii) should be noted in producing the third conversion signal Vc.

(i) First Instruction

It should be noted that the curvilinear start point VxTyp is varied in response to the actual state of the amplifier 51. The distinction between FIGS. 2A and 2B reflects variations of VxTyp, wherein the graph of FIG. 2A is drafted to cope with a large value of VxTyp, while the graph of FIG. 2B is drafted to cope with a small value of VxTyp.

In this regard, the present embodiment sets a curvilinear limit value VXTHD, which is a certain constant designating a lower limit of the curvilinear start point VxTyp. When the value of VxTyp becomes lower than the curvilinear limit value VXTHD (where VxTyp<VXTHD), the value of VxTyp no longer serves to designate the curvilinear start point. In this case, the smooth curvilinear correction unit 30 does not perform the smooth curvilinear process and therefore does not change the second conversion signal Vx so as to directly output it as the third conversion signal Vc (where Vc=Vx) to the second gain correction unit 40. The alphanumeric code "SelA=Vx, in case of VxTyp<VXTHD" designates the above operation.

When VxTyp=VXTHD, the smooth curvilinear process is started from VxTyp or VXTHD. FIG. 2B shows the critical state in which the value of VxTyp (where VxTyp=VXTHD) is used as the start point of the smooth curvilinear process.

The VxTyp setting portion 32 sets the value of VxTyp to achieve the above process. When VxTyp≧VXTHD, the value of VxTyp set by the VxTyp setting portion 32 is directly used as the start point of the smooth curvilinear process (see the point indicated by "VXTHD=VxTyp" in FIG. 2B). When VxTyp<VXTHD, the value of VXTHD is substituted for the value of VxTyp.

(ii) Second Instruction

The function F should be set in such a way that the distortion factor of the speaker drive signal Vo does not exceed the predetermined limit value even when the second conversion signal Vx has the maximum allowable value. For example, when the predetermined limit value of the distortion factor is set to 10%, the function F is formed such that the maximum distortion factor for the speaker drive signal Vo can be at 10% at large.

The predetermined limit value of the distortion factor may vary dependent upon the application of the present embodiment. When the amplifier circuit 1 is applied to a car stereo device, for example, it is preferable that the predetermined limit value of the distortion factor be set to 10% or so. When the amplifier circuit 1 is applied to a high-quality audio device, it is preferable that the predetermined limit value of the distortion factor be strictly limited to 3% or so.

The function F can be formed using the known mathematical functions such as the logarithmic function and the trigonometric function. It is possible to employ a single function or a combination of multiple functions. Even when the outline of the function F is characterized by the logarithmic function, the function F may embrace a series of functions F1, F2, ..., Fn which differ from each other in terms of coefficients.

In addition, it is preferable that the function F represent a monotonically increasing function in which as the second conversion signal Vx increases, the third conversion signal Vc gradually increases with an upwardly convex curvature (see FIGS. 2A, 2B).

The present embodiment determines a curvilinear range VSC in advance in connection with the actual form of the function F. As shown in FIGS. 2A and 2B, the curvilinear range VSC has a certain constant defining a range of processing which starts from the start point VxTyp of the smooth curvilinear process along the axis of Vx. That is, the smooth curvilinear process is performed only when the second conversion signal Vx falls within the range of VxTyp≦Vx≦VxTyp+VSC.

Since the value of VxTyp+VSC is univocally determined based on the value of VxTyp, the upper limit value VxMAX for the range of the smooth curvilinear process must be fixed to a certain value; that is, VxMAX indicates the maximum allowable value for Vx. In short, the function F is formed such that the distortion factor of the speaker drive signal Vo be less than the predetermined limit value of the distortion factor when Vx=VxMAX.

It is presumed that the second conversion signal Vx normally has a certain periodicity; hence, the condition of "Vx=VxMAX" can be translated into the condition in which the second conversion signal Vx has the maximum amplitude VxMAX of a sine-wave signal.

In the above, the curvilinear limit value VXTHD is also involved in forming the function F. As the value of VxTyp becomes smaller, the smooth curvilinear process is started earlier so as to gradually increase the distortion factor of the speaker drive signal Vo (see FIGS. 2A, 2B). In regard to the setting of the actual value of VXTHD, it is preferable to employ the foregoing reference of "distortion factor less than the predetermined limit value (e.g. 10%)". In this case, the form of the function F is determined at once; then, the preferred value of VXTHD is determined by repeated trial and error with respect to the distortion factor for the speaker drive signal Vo.

The smooth table 31 stores the actual form of the function F and the aforementioned value of the curvilinear range VSC, while the VxTyp setting portion 32 stores the curvilinear limit value VXTHD.

In the smooth curvilinear correction unit 30, the value of VxTyp set by the VxTyp setting portion 32 is subtracted from the second conversion signal Vx output from the characteristic correction unit 20, and then the subtraction result is subjected to the smooth curvilinear process; thereafter, the value of VxTyp is added to the result of the smooth curvilinear process. Thus, it is possible to exert the function F on the second conversion signal Vx.

The above is explained in detail with reference to FIGS. 2A and 2B. Since the curvilinear range VSC is a certain constant, the value of VxTyp+VSC increases proportionally with the value of VxTyp. When the smooth table 31 stores the form of the function F as Vc=log(Vx) (representing a monotonically increasing function), for example, the third conversion signal Vc monotonically increases with the value of VxTyp. In this case, the third conversion signal Vc produced by the smooth curvilinear correction unit 30 should be larger in the case of FIG. 2A rather than in the case of FIG. 2B (see the point indicated by the dotted line of VcMAX). Compared to the foregoing case of the proportional relationship where $Vc=Vy=a \cdot Vx$ (where $a \geq 1$), an increment of the third conversion signal Vc subjected to the function F is small but the value of Vc will be certainly increased with the value of Vx.

When VxTyp=VXTHD, the value of VxTyp produced in the smooth curvilinear correction unit 30 becomes equal to the minimum value, i.e. VCTHD. Upon receiving the maximum value VxMAX of the second conversion signal Vx, the smooth curvilinear correction unit 30 produces the maximum value VcMAX of the third conversion signal Vc, wherein the maximum value VcMAX cannot be lower than the minimum value VCTHD.

Finally, the smooth curvilinear correction unit 30 maintains a certain power in the third conversion signal Vc to be supplied to the second gain correction unit 40.

[II] Second Stage

The second gain correction unit 40 determines the gain coefficient Gc by use of the value of VxTyp output from the amplification unit 50. As shown in FIG. 1, the gain coefficient Gc is calculated as Gc=VxTyp/VXTHD.

When Gc=VxTyp/VXTHD>1, the Gc setting portion 42 univocally sets Gc=1.0 regardless of the calculation of VxTyp/VXTHD. The condition of VxTyp/VXTHD>1 is equivalent to the condition of VxTyp>VXTHD; hence, as described in the first stage [I], the value of VxTyp serves as the start point of the smooth curvilinear process. In this case, the value of VxTyp is not so small; hence, the amplifier 51 or the speaker has enough room in operation.

Univocally setting Gc=1.0 is supported by the aforementioned circumstances. This is because the fourth conversion signal Vd is calculated by way of Vd=Gc·Vc=Vc=F(Vx), i.e. Vd=F(Vx), while maintaining the aforementioned equation of Vc=F(Vx). That is, the second gain correction unit 40 is able to still maintain power in producing the fourth conversion signal Vd.

When Gc=VxTyp/VXTHD≦1, the Gc setting portion 42 maintains Gc=VxTyp/VXTHD without changing the gain coefficient Gc. The condition of VxTyp/VXTHD≦1 indicates the condition of VxTyp≦VXTHD; hence, as described in the first stage [I], the value of VxTyp does not serve as the start point of the smooth curvilinear process, wherein the smooth curvilinear correction unit 30 directly outputs the value of Vx as the value of Vc. In this case, the value of VxTyp is a very small value; hence, the amplifier 51 or the speaker has almost no room in operation.

Maintaining Gc=VxTyp/VXTHD<1 (an equal sign is omitted for the sake of simplification) is supported by the aforementioned circumstances. Because, it is necessary to decrease the fourth conversion signal Vd, wherein Vd<Vc or Vd<Vx where Gc<1 and Vd=Gc·Vc=Gc·Vx. Compulsorily decreasing the value of Vd prevents clipping from occurring in the speaker drive signal Vo output from the amplifier 51.

Even when the above inequality is involved in the equality representing Gc=VxTyp/VXTHD=1, the value of Gc substituting for VxTyp/VXTHD remains at "1" (where Gc=1); hence, the same result is produced by any one of the above procedures. In this connection, the calculation of Vd is regarded as Vd=F(Vx) as described in the first stage [I]. In either case, the condition of VxTyp=VXTHD represents the critical state.

As described in the first stage [I] and the second stage [II], the amplifier circuit 1 is designed to appropriately rectify the fourth conversion signal Vd (which is supplied to the amplifier 51) based on the value of VxTyp which fluctuates in response to the state of the amplifier 51. The present embodiment is designed to additionally perform first and second processes.

[A] First Process

The second conversion signal Vx supplied to the smooth curvilinear correction unit 30 is derived from the output of the characteristic correction unit 20 receiving the first conversion signal Vg; that is, the characteristic correction unit 20 converts the first conversion signal Vg into the second conversion signal Vx.

Figure 3A:
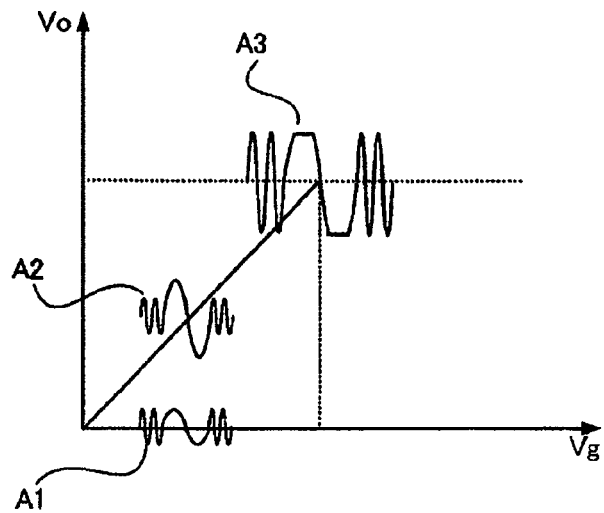
FIG. 3A is a graph showing fluctuations of a speaker drive signal Vo in response to the low-frequency component of a first conversion signal Vg subjected to a boost process.

As described above, the first conversion signal Vg is subjected to the function F. Herein, the function F is regarded as a boost process for boosting the level of the low-frequency component of the first conversion signal Vg, for example. According to the boost process, as shown in FIG. 3A, the low-frequency component of the first conversion signal Vg (indicated by the symbol A1) is partially increased in level (see the symbol A2). Thus, it is possible to appropriately drive the speaker in terms of electroacoustic/audio effects.

However, the boost process causes an excessive input level to the amplifier 51, which in turn likely causes a great distortion in the speaker drive signal Vo (see the symbol A3 in FIG. 3A).

To cope with the above drawback, the present invention adjusts the gain coefficients G1 and G2 in response to fluctuations of VxTyp so as to appropriately control the boost process on the first conversion signal Vg such that the second conversion signal Vx may not exceed the default value VIMAX.

The gain coefficients G1 and G2 are adjusted based on the maximum value VxMax (which is produced by adding the curvilinear range VSC to the value of VxTyp set by the VxTyp setting portion 32 in the smooth curvilinear correction unit 30) and the default value VIMAX. This adjustment can be subdivided into three procedures.

(i) First Procedure where VxMAX is Far Less than VIMAX.

It is regarded that the amplifier 51 or the speaker still has enough room in operation since the maximum value VxMAX is relatively small; hence, no problem occurs even when the processed signal Vp of the boost process is directly supplied to the amplifier 51. Herein, the gain coefficient G2 for the first conversion signal Vg is set to "0" while the gain coefficient G1 for the processed signal Vp resultant from the boost process is set to "1". Since the second conversion signal Vx is produced by adding the first conversion signal Vg and the processed signal Vp together, the second conversion signal Vx is produced as Vx=Vp (see the symbol B3 in FIG. 3B and FIG. 3C).

(ii) Second procedure where VxMAX is approximate to VIMAX

It is regarded that the amplifier 51 or the speaker has almost no room in operation since the maximum value VxMAX is relatively large; hence, some problem occurs when the processed signal Vp of the boost process is directly supplied to the amplifier 51. In this case, the gain coefficient G2 is set to "1" while the gain coefficient G1 is set to "0". Thus, it is possible to produce the second conversion signal Vx as Vx=Vg.

Figure 3B:
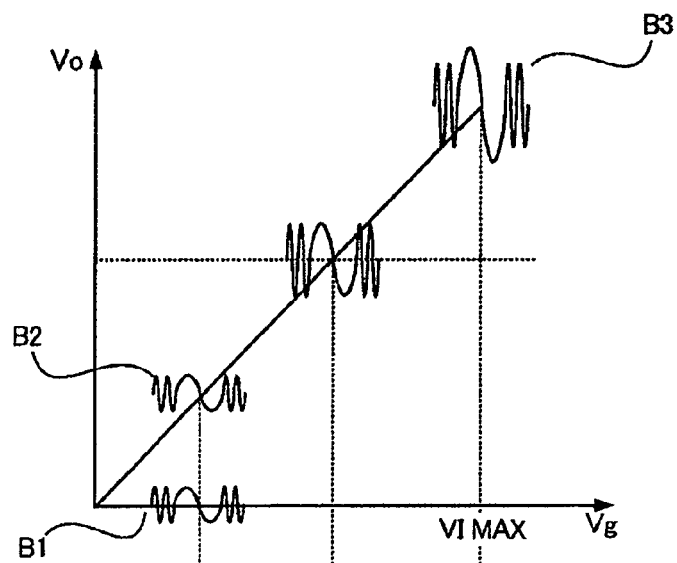
FIG. 3B is a graph showing the relationship between the first conversion signal Vg and the speaker drive signal Vo in connection with the relationship between VxMAX and VIMAX.
Figure 3C:
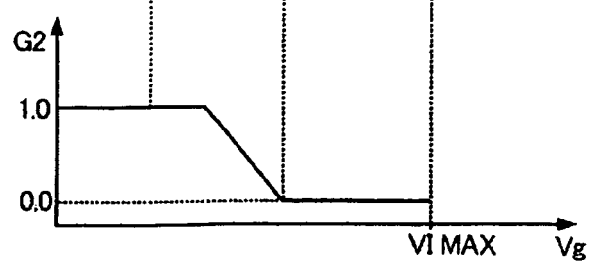
FIG. 3C is a graph showing the setting of a gain coefficient G2 applied to the first conversion signal Vg in light of the graph of FIG. 3B.

This procedure is shown in FIG. 3B, wherein the low-frequency component of the first conversion signal Vg (see the symbol B1) is not increased in level (see the symbol B2). This can be understood by comparison between the waveform A2 of FIG. 3A and the waveform B2 of FIG. 3B. That is, the second procedure ignores the boost process.

(iii) Third Procedure which is Intermediate Between (I) and (II)

It is regarded that the amplifier 51 or the speaker does not have enough room in operation but still has some room in operation since the maximum value VxMAX has an intermediate value; hence, the characteristic correction unit 20 allows the processed signal Vp of the boost process to be supplied to the amplifier 51 in some extent. Herein, the gain coefficients G1 and G2 are appropriately varied between "0" and "1". Thus, it is possible to produce the second conversion signal Vx as Vx=G1·Vp+G2·Vg.

In the above, it is preferable to adjust the gain coefficients G1 and G2 in accordance with a simple graph shown inside the gain coefficient adjuster 21 (see FIG. 1) such that one of the gain coefficients G1 and G2 increases while the other decreases.

It is preferable to determine the increment/decrement process of the gain coefficients G1 and G2 in light of sound power and electroacoustic/audio effects. The present embodiment is designed preferably in terms of sound power and electroacoustic/audio effects. In this connection, it is possible to modify the present invention in light of the nonlinear adjustment in which the gain coefficients G1 and G2 nonlinearly increase or decrease.

The characteristic correction unit 20 mixes the first conversion signal Vg with the processed signal Vp of the boost process at an appropriate mixing ratio so as to produce the second conversion signal Vx, which is then supplied to the smooth curvilinear correction unit 30.

The boundaries between the first, second, and third procedures may not be univocally defined due to the vagueness of expression such as "far less than" and "approximate to". However, they can be easily defined on the basis of the basic principle in which the boost process can be performed as long as its resultant signal level does not exceed the default value VIMAX.

Incidentally, the present embodiment is designed such that the detailed procedure of the boost process is established in light of the magnitude comparison between VxMAX and VIMAX. In the present embodiment, it does not matter whether boundaries between procedures of the boost process are slightly floating in definition.

[B] Second Process

In connection with the first process [A], the first conversion signal Vg supplied to the characteristic correction unit 20 is derived from the output of the first gain correction unit 10 receiving the input signal Vi; that is, the first gain correction unit 10 converts the input signal Vi into the first conversion signal Vg.

In this case, the aforementioned relationship of Gin·Vi=Vg≦VIMAX is normally established. Herein, the default value VIMAX indicates the maximum processable level for the amplifier circuit 1; hence, the first conversion signal Vg (which is produced based on the input signal Vi) as well as the second conversion signal Vx and the third conversion signal Vc (which are produced based on the first conversion signal Vg) cannot flee from the limitation of VIMAX. In addition, the maximum value VxMAX cannot exceed VIMAX (see FIGS. 2A, 2B).

The limitation of VIMAX secures the stable operation of the amplifier circuit 1.

Next, the overall processing of the amplifier circuit 1 will be described with reference to FIG. 4.

In step S101, the first gain correction unit 10 converts the input signal Vi into the first conversion signal Vg (where Vg≦VIMAX).

In step S200, the characteristic correction unit 20 produces the second conversion signal Vx based on the first conversion signal Vg. Herein, three procedures are selectively performed based on the value of VxTyp based on the present state of the amplifier 51. A first procedure is performed in step S201 on the condition that the maximum value VxMAX (where VxMAX=VxTyp+VSC) is relatively small, wherein the processed signal Vp subjected to the function F is directly output as the second conversion signal Vx. A second procedure is performed on the condition that the maximum value VxMAX is relatively large (see the rightmost part of step S200), wherein the first conversion signal Vg is directly output as the second conversion signal Vx while ignoring the function F. A third procedure is performed in step S202 on the condition that the maximum value VxMAX is an intermediate value, wherein the processed signal Vp subjected to the function F is mixed with the first conversion signal Vg so as to produce the second conversion signal Vx. In connection with the foregoing description, the condition where VxMAX is relatively small is regarded as "VxMAX is far less than VIMAX", while the condition where VxMAX is relatively large is regarded as "VxMAX is approximate to VIMAX".

In step S400, the fourth conversion signal Vd is produced based on the second conversion signal Vx, wherein the processing is performed differently depending upon the value of VxTyp. When VxTyp≧VXTHD, the flow proceeds to step S401 so as to perform the smooth curvilinear process since the decision result of step S301 is "YES". When VxTyp<VXTHD, the flow proceeds to step S402 so as to perform a gain decrement process on the gain coefficient Gc since the decision result of step S301 is "NO". Specifically, the smooth curvilinear correction unit 30 performs the smooth curvilinear process of step S401, while the second gain correction unit 40 performs the gain decrement process of step S402.

The amplifier circuit 1 is characterized by the following technical features.

(1) First feature

As described in the first stage [I] and the second stage [II], the amplifier circuit 1 prevents an excessive input signal from being supplied to the amplifier 51 in the critical state while maintaining an adequate power of the speaker drive signal Vo as high as possible. In other words, the present embodiment prevents the limitation of the amplitude of an input signal to the amplifier 51 from degrading the power and sound quality. This is realized by the smooth curvilinear correction unit 30 and the smooth curvilinear process of step S401 shown in FIG. 4.

Figure 5:
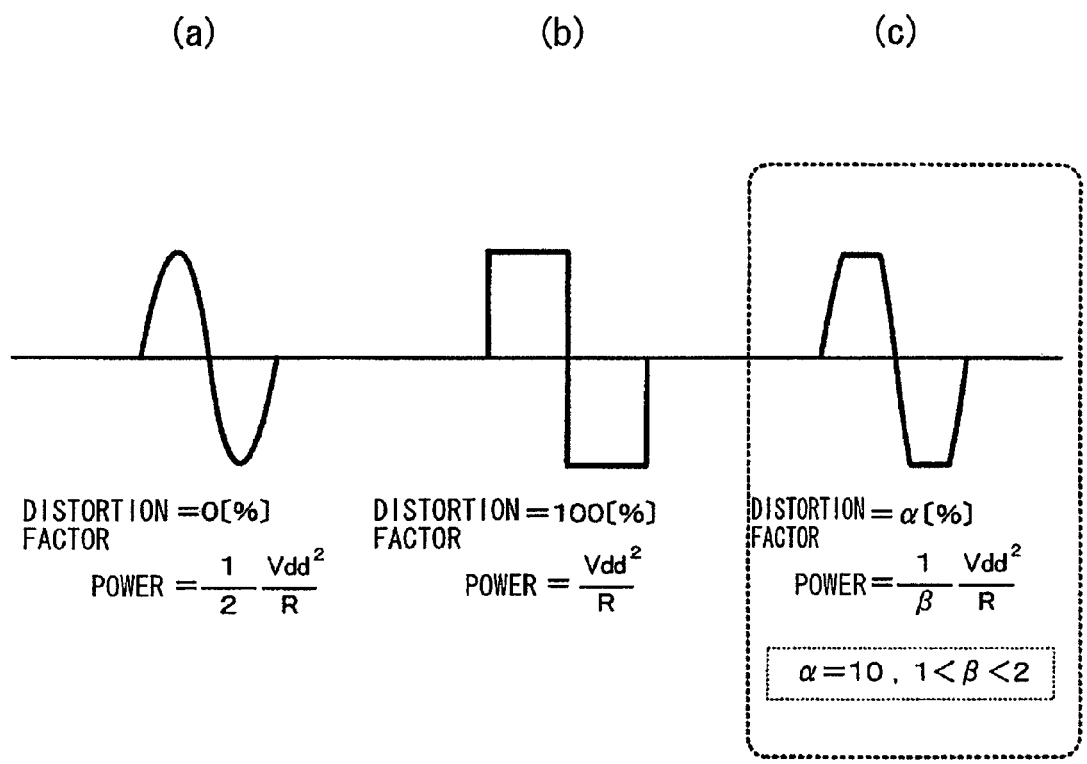
FIG. 5 shows a sine-wave signal, a rectangular-wave signal, and an intermediate signal as the speaker drive signal Vo.

The first feature of the present embodiment will be further described with reference to FIG. 5 which shows three waveforms (a), (b), and (c) regarding the speaker drive signal Vo in order to explain the conceptual relationship between the distortion factor and the power of sound. FIG. 5(*a*) shows the waveform of a sine-wave signal which is ideal for the speaker drive signal Vo; FIG. 5(*b*) shows the waveform of a rectangular-wave signal; and FIG. 5(*c*) is an intermediate signal whose waveform is intermediate between the sine-wave signal and the rectangular-wave signal.

The waveform of FIG. 5(*a*) has a distortion factor of 0%, while the waveform of FIG. 5(*b*) has a distortion factor of 100%. In addition, the power of the waveform of FIG. 5(*a*) is $½·Vdd^2/R$, and the power of the waveform of FIG. 5(*b*) is $Vdd^2/R$, wherein "Vdd" represents the source voltage of the amplifier 51, and "R" represents a load resistance.

The conventional technology employs the gain decrement process to be immediately performed when the amplifier 51 in the critical state forms the speaker drive signal Vo having the waveform of FIG. 5(*b*) or the waveform of FIG. 5(*c*), whereby the gain of the amplifier 51 is directly lowered so as to prevent the clipping from occurring as shown in FIG. 5(*b*) and FIG. 5(*c*). This decreases the level of the speaker drive signal Vo, thus decreasing the power of sound.

The present embodiment is advantageous to the conventional technology because the smooth curvilinear process does not immediately decreases the gain of the amplifier 51 in the critical state. This advantage is depicted by the aforementioned point of VCTHD in FIGS. 2A and 2B in which the third conversion signal Vc (as well as the fourth conversion signal Vd and the speaker drive signal Vo) is still maintained at a certain level of power.

However, it is presumed that the speaker drive signal Vo may contain a certain degree of distortion. Considering the relationship between the human's hearing ability and the sound of the speaker, it cannot be said that the speaker drive signal Vo does not allow for any distortion at all. Technologically, it is very difficult to form an ideal sine-wave for the speaker drive signal Vo. Furthermore, it is not advantageous to strictly restrict the distortion in the waveform of the speaker drive signal Vo.

For this reason, it is practical to appropriately set an allowable distortion factor and to thereby secure an adequate power as high as possible within the allowable distortion factor.

The present embodiment is well designed in terms of the above aspect, since the present embodiment is able to moderately increase the third conversion signal Vc by way of the smooth curvilinear process. This reliably prevents an excessive input signal from being supplied to the amplifier 51, wherein a certain degree of distortion may be imparted to the speaker drive signal Vo but the power is not degraded so much.

The waveform of FIG. 5(*c*) is practical for the amplifier 51 in consideration of a symbol c shown in FIGS. 2A and 2B. The present embodiment positively allows for the waveform of FIG. 5(*c*), which is intermediate between the waveform of FIG. 5(*a*) and the waveform of FIG. 5(*b*), as the speaker drive signal Vo. In general, the power of the waveform of FIG. 5(*c*) is expressed by $1/\beta \cdot Vdd^2/R$ (where $1<\beta<2$), the power of which is higher than the power of the waveform of FIG. 5(*a*). In FIG. 5(*c*), "α" denotes an allowable distortion factor, which is set to 10%, for example. In this connection, α and β are complementary to each other.

(2) Second Feature

As described in the first stage [I] in conjunction with FIGS. 2A and 2B, the amplifier circuit 1 performs the smooth curvilinear process in the limited situation where Vx≧VxTyp. In other words, the present embodiment does not perform the smooth curvilinear process unconditionally regardless of the level of the second conversion signal Vx. This is because the fourth conversion signal Vd causing the critical state of the amplifier 51 may take different levels, all of which do not cause the clipping in the speaker drive signal Vo. Considering this matter, it is rational for the amplifier circuit 1 to perform the smooth curvilinear process in the limited situation.

Comparing with an amplifier circuit which is designed to normally perform the smooth curvilinear process on the second conversion signal Vx regardless of its level, the present embodiment is advantageous in that it can simplify and speedup the processing. In particular, when the second conversion signal Vx is relatively small (where Vx<VxTyp), the present embodiment produces the third conversion signal Vc directly reflecting the second conversion signal Vx (where Vc=Vx); hence, the present embodiment is advantageous in that it can maintain an adequate level of the speaker drive signal Vo, it can avoid time-consuming (or energy-consuming) conversion processes, and it can directly reflect the original information represented by the input signal Vi in the speaker drive signal Vo.

(3) Third Feature

As described in the second stage [II], the amplifier circuit 1 immediately performs the gain decrement process on the gain coefficient Gc when the value of VxTyp become lower than the default value VXTHD by means of the Gc setting portion 42 and the like. In this case, the distortion factor of the speaker drive signal Vo becomes higher than the predetermined threshold, it is preferable to perform the gain decrement process although the power of sound is slightly degraded.

In connection with the second feature (where VxTyp≧VXTHD), the present embodiment is able to effectively prevent an excessive input signal from being supplied to the amplifier 51. In this connection, the third feature is realized by the second gain correction unit 40 and the gain decrement process of step S402.

(4) Fourth Feature

As described in the first process [A], the amplifier circuit 1 prevents the processed signal Vp subjected to the function F (or the characteristic correction process) from being directly supplied to the amplifier 51 in the critical state without any restriction. This is realized by the characteristic correction unit 20 and step S200 regarding the production of the second conversion signal Vx.

In light of the magnitude comparison between VxMAX and VIMAX, the present embodiment determines either to produce the second conversion signal Vx constituted of only the processed signal Vp (subjected to the function F) or to produce the second conversion signal Vx without reflecting the function F. That is, the present embodiment is capable of appropriately changing the processing depending upon the first effect for maintaining an adequate power and the second effect for preventing the clipping.

Thus, it is possible to demonstrate both of the first effect ascribed to the function F and the second effect for preventing the clipping with a good balance.

(5) Fifth Feature

The amplifier circuit 1 does not necessarily employ alternative options whether to perform the function F. As described in the first process [A] in conjunction with FIG. 4, there is an intermediate option in which the processed signal Vp subjected to the function F is appropriately mixed with the first conversion signal Vg so as to produce the second conversion signal Vx; hence, it is possible to achieve the above effects in an effective way, since the gain coefficients G1 and G2 are finely adjusted to follow up with small changes of the status of the amplifier 51.

Since the gain coefficients G1 and G2 are alternately changed such that one of them is increased while the other is decreased, the present embodiment is able to secure an adequate power of sound in terms of electroacoustic/audio effects.

The present invention is not necessarily limited to the present embodiment, which can be modified in various ways.

Figure 4:
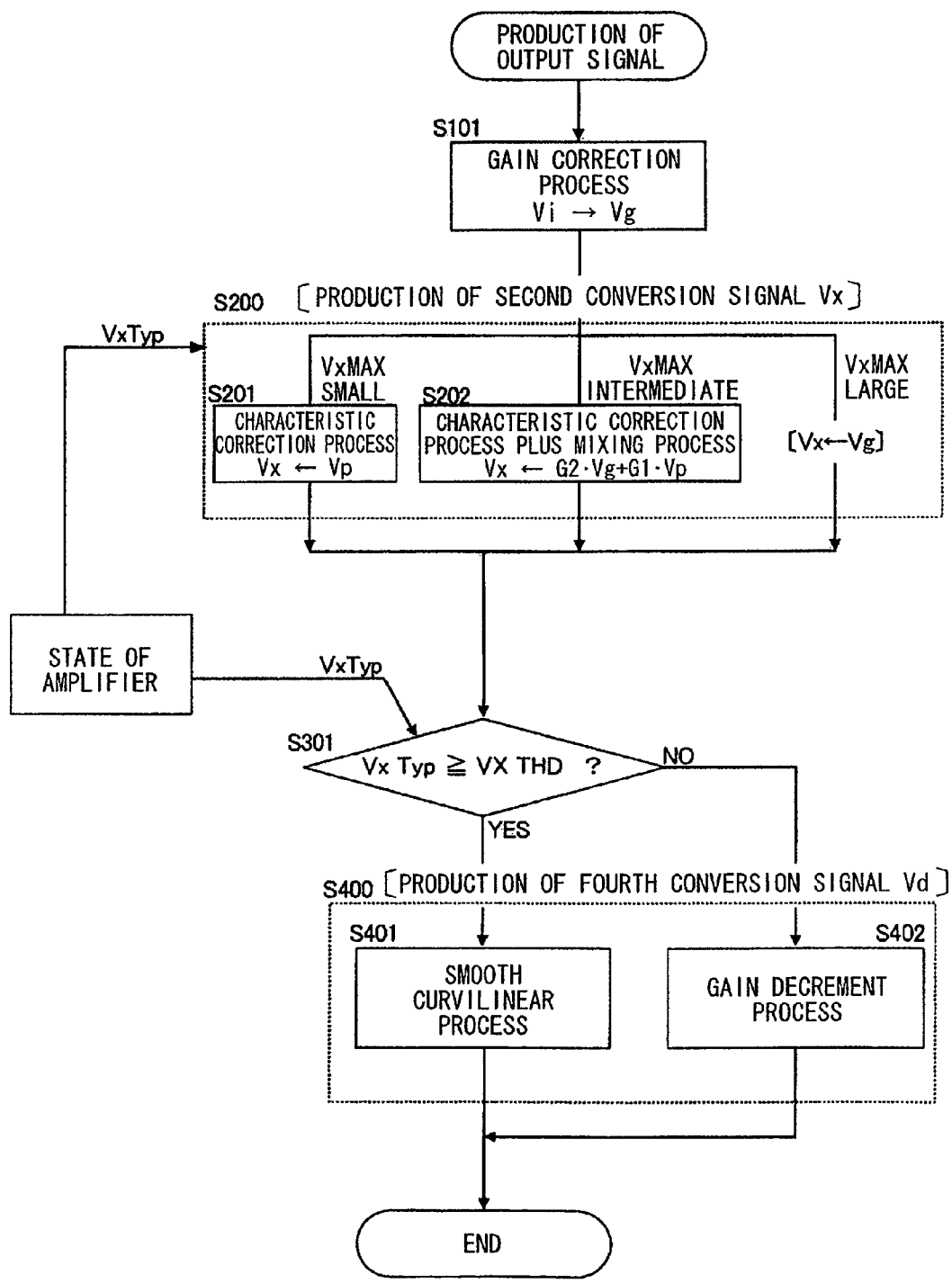
FIG. 4 is a flowchart showing the overall processing of the amplifier circuit.

It is possible to determine the boundaries between three procedures (where the value of VxMAX is small, large, and intermediate) as described in the first process [A] in conjunction with FIG. 4.

Basically, the boundaries between three procedures are appropriately determined based on conditions defined by the ability of the amplifier 51. As long as these conditions are satisfied, it is possible to freely determine the boundaries between three procedures.

The first process [A] (regarding the function F and the production of the second conversion signal Vx, see FIG. 4) is similar to the first stage [I] and the second stage [II] (regarding the smooth curvilinear process and the gain decrement process, see FIG. 4) in terms of the common basis of using the value of VxTyp.

Regarding the boundaries between three procedures, it is possible to introduce relativity between the first process [A] and the first and second stages [I], [II]. For example, it is possible to determine the boundaries relative to the curvilinear limit value VXTHD which serves as an important factor in the first and second stages [I], [II]. Details will be described with reference to FIG. 6.

Figure 6:
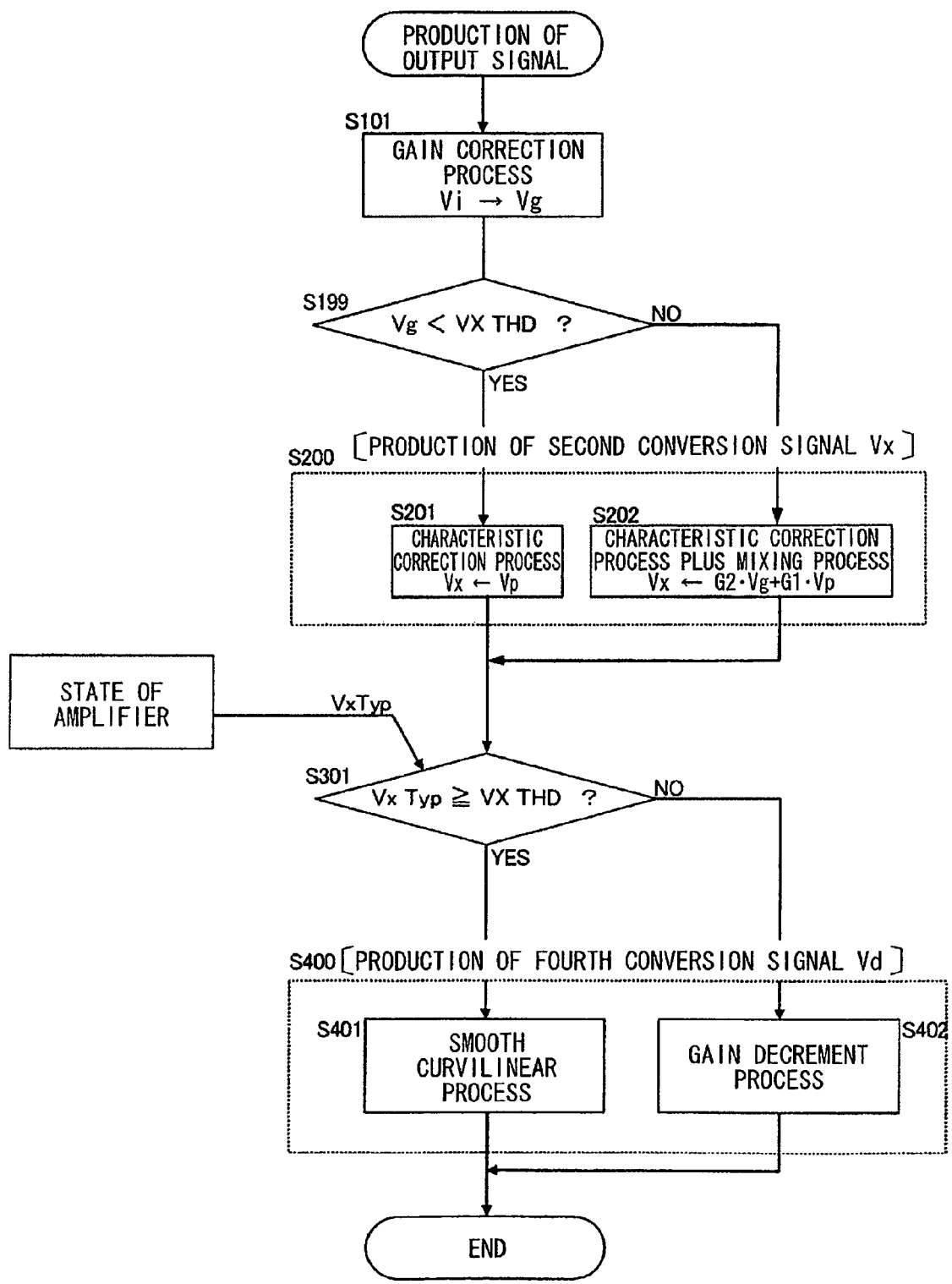
FIG. 6 is a flowchart showing a modification of the processing of the amplifier circuit.

FIG. 6 is a flowchart which introduces relativity between step S200 (regarding the production of the second conversion signal Vx) and step S400 (regarding the production of the fourth conversion signal Vd) in the flowchart of FIG. 4.

When Vg<VXTHD, the decision result of step S199 turns to "YES" so that the flow proceeds to step S201 in which Vx=Vp. When VXTHD≦Vg (≦VIMAX), the decision result of step S199 turns to "NO" so that the flow proceeds to step S202 in which Vx=G1·Vp+G2·Vg. The flowchart of FIG. 6 differs from the flowchart of FIG. 4 in that the first conversion signal Vg is not directly output as the second conversion signal Vx; in other words, the second conversion signal includes some components reflecting the function F (e.g. the boost process). Reviewing the flowchart of FIG. 4, two steps regarding "VxMAX LARGE" and "VxMAX INTERMEDI- ATE" are convoluted into a single step regarding "VxMAX INTERMEDIATE" where Vx=G1·Vp+G2·Vg in the flowchart of FIG. 6.

The flowchart of FIG. 6 employs the same content as step S400 (regarding the production of the fourth conversion signal Vd) which is performed subsequently to step S200. That is, when VxTyp≧VXTHD, the flow proceeds to step S401 to perform the smooth curvilinear process. When VxTyp<VXTHD, the flow proceeds to step S402 to perform the gain decrement process.

As described above, the first process [A] is connected with the first and second stages [I], [II] with respect to the curvilinear limit value VXTHD.

The above modification demonstrates an additional effect in addition to the aforementioned effects of the present embodiment.

That is, when Vg<VXTHD, the determination whether to perform the smooth curvilinear process on the second conversion signal Vx depends upon the value of Vx=Vp. As shown in FIGS. 2A and 2B, the second conversion signal Vx is linearly converted into the third conversion signal Vc when the relationship of Vx<VxTyp still remains with respect to Vx subjected to the function F (e.g. the boost process), while the second conversion signal Vx is converted into the third conversion signal Vc along with the smooth curvilinear process when the relationship of Vx≧VxTyp is established.

The above processing is similarly performed even when the relationship of Vg≧VXTHD is established, wherein the second conversion signal Vx is converted into the third conversion signal Vc in light of the magnitude comparison between Vx=G1·Vp+G2·Vg and VxTyp.

In either case, the relationship of Vx≧VxTyp may be established with a high probability due to the boost process so that the second conversion signal Vx is likely subjected to the smooth curvilinear process. As described above, the smooth curvilinear process aims at immediately maintaining an adequate level of the speaker drive signal Vo while preventing an excessive input signal from being supplied to the amplifier 51. In the flowchart of FIG. 6, it is possible to drastically reduce the likelihood in which an excessive input signal is supplied to the amplifier 51 even when the second conversion signal Vx reflects the boost process. In addition, it is possible to secure the outstanding effect of the boost process. Thus, this modification is able to improve the sound quality in terms of electroacoustic/audio effects.

Instead of "Vg<VXTHD", it is possible to use "Vg<VxTyp" as the decision of step S199.

It is possible to provide other measures of setting the gain coefficients G1 and G2 with respect to the curvilinear limit value VXTHD. It is possible to introduce frequency characteristic processing in connection with the characteristic correction processor 22.

Lastly, it is possible to design variations of amplifier circuits within the scope of the invention as defined in the appended claims.

What is claimed is:

1. An amplifier circuit comprising:
a first gain correction unit converting an input signal into a first conversion signal;
a characteristic correction unit converting the first conversion signal into a second conversion signal in accordance with a characteristic correction process;
a smooth curvilinear correction unit converting the second conversion signal into a third conversion signal in accordance with a smooth curvilinear process in response to a state variable of amplification;
a second gain correction unit converting the third conversion signal into a fourth conversion signal; and
an amplification unit performing amplification on the fourth conversion signal, thus producing an output signal,
wherein the amplification unit generates the state variable of amplification so as to prevent clipping from occurring in the output signal.

2. The amplifier circuit according to claim 1, wherein the third conversion signal or the fourth conversion signal increases in level with less than an increment of the second conversion signal in accordance with the smooth curvilinear process.

3. The amplifier circuit according to claim 1, wherein the state variable of amplification represents a curvilinear start point from which the smooth curvilinear process is started on the second conversion signal.

4. The amplifier circuit according to claim 1, wherein when the second conversion signal has a maximum value, the smooth curvilinear process is performed such that a distortion factor of the output signal does not exceed a predetermined limit value.

5. The amplifier circuit according to claim 1, wherein when the state variable of amplification is less than a default value, the second conversion signal is subjected to a gain decrement process instead of the smooth curvilinear process.

6. The amplifier circuit according to claim 5, wherein the default value is determined in such a way that, when the second conversion signal has a maximum value, a distortion factor of the output signal, which is produced based on the second conversion signal subjected to the smooth curvilinear process whose start point is designated by the default value of the state variable of amplification, does not exceed a predetermined limit value.

7. The amplification circuit according to claim 1, wherein the characteristic correction process corresponds to a frequency characteristic process which is performed on the first conversion signal, and wherein the frequency characteristic process is changed with respect to a high-level portion and a low-level portion of the first conversion signal based on the default value of the state variable of amplification.

8. An amplifier circuit comprising:
an amplifier that amplifies a first signal so as to produce a second signal; and
a corrector that receives a third signal so as to perform a smooth curvilinear process on a part or the entirety of the third signal based on a state variable, which varies in response to a state of the amplifier, thus producing the first signal,
wherein the smooth curvilinear process embraces a curvilinear process in which the third signal increases with a single unit of increment while the first signal increases with less than the single unit of increment, thus imparting a curvilinear characteristic to the third signal.

9. An amplifier circuit comprising:
an amplifier that amplifies a first signal so as to produce a second signal; and
a corrector that receives a third signal so as to perform a smooth curvilinear process on a part or the entirety of the third signal based on a state variable, which varies in response to a state of the amplifier, thus producing the first signal,
wherein the corrector performs the smooth curvilinear process on a large-amplitude portion of the third signal, which is larger than the state variable, thus producing the first signal.

10. The amplifier circuit according to claim 8, wherein, with respect to the maximum value of the third signal, the smooth curvilinear process is performed on the third signal in such a way that a distortion factor of the second signal becomes lower than a predetermined value.

11. The amplifier circuit according to claim 9, wherein, with respect to the state variable less than a first constant which is determined in advance, the corrector does not perform the smooth curvilinear process but multiplies the third signal by a gain coefficient less than "1", thus producing the first signal.

12. The amplifier circuit according to claim 11, wherein, with respect to the maximum value of the third signal, the first constant is determined such that a distortion factor of the second signal, which is produced by performing the smooth curvilinear process with a start point corresponding to the first constant on the third signal, becomes less than a predetermined value.

13. The amplifier circuit according to claim 11 further comprising a characteristic corrector which receives a fourth signal and which chooses whether or not to perform a frequency characteristic process on a part or the entirety of the fourth signal based on the state variable, wherein the characteristic corrector changes the frequency characteristic process in response to a large-amplitude portion and a small-amplitude portion of the fourth signal compared to the first constant.

* * * * *